(12) United States Patent
Lei et al.

(10) Patent No.: US 12,463,052 B2
(45) Date of Patent: Nov. 4, 2025

(54) DIRECTIONAL SELECTIVE JUNCTION CLEAN WITH FIELD POLYMER PROTECTIONS

(71) Applicant: Applied Materials, Inc., Santa Clara, CA (US)

(72) Inventors: Yu Lei, Belmont, CA (US); Xuesong Lu, San Jose, CA (US); Tae Hong Ha, San Jose, CA (US); Xianmin Tang, San Jose, CA (US); Andrew Nguyen, San Jose, CA (US); Tza-Jing Gung, San Jose, CA (US); Philip A. Kraus, San Jose, CA (US); Chung Nang Liu, Foster City, CA (US); Hui Sun, San Jose, CA (US); Yufei Hu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 354 days.

(21) Appl. No.: 17/846,155

(22) Filed: Jun. 22, 2022

(65) Prior Publication Data

US 2022/0336223 A1   Oct. 20, 2022

Related U.S. Application Data

(62) Division of application No. 16/881,145, filed on May 22, 2020, now Pat. No. 11,562,909.

(51) Int. Cl.
*H01J 37/32* (2006.01)
*H01L 21/02* (2006.01)
(Continued)

(52) U.S. Cl.
CPC .. *H01L 21/31116* (2013.01); *H01J 37/32091* (2013.01); *H01J 37/321* (2013.01);
(Continued)

(58) Field of Classification Search
CPC ......... B65B 31/02; B65B 47/00; B65B 65/00; B65B 51/14; B65B 47/04; H01J 37/32091;
(Continued)

(56) References Cited

U.S. PATENT DOCUMENTS 8,501,629 B2   8/2013   Tang et al.
9,396,961 B2   7/2016   Arghavani et al.
(Continued)

FOREIGN PATENT DOCUMENTS

CN   101558479 A   10/2009
CN   109817583 A   5/2019
(Continued)

OTHER PUBLICATIONS

PCT Written Opinion and International Search Report for PCT/US2021/032706, 10 pgs.

*Primary Examiner* — Charlee J. C. Bennett
(74) *Attorney, Agent, or Firm* — SERVILLA WHITNEY LLC (57) ABSTRACT

Described is a process to clean up junction interfaces for fabricating semiconductor devices involving forming low-resistance electrical connections between vertically separated regions. An etch can be performed to remove silicon oxide on silicon surface at the bottom of a recessed feature. Described are methods and apparatus for etching up the bottom oxide of a hole or trench while minimizing the effects to the underlying epitaxial layer and to the dielectric layers on the field and the corners of metal gate structures. The method for etching features involves a reaction chamber equipped with a combination of capacitively coupled plasma and inductive coupled plasma. $CH_xF_y$ gases and plasma are used to form protection layer, which enables the selectively etching of bottom silicon dioxide by $NH_3$—$NF_3$ plasma. Ideally, silicon oxide on EPI is removed to ensure low-
(Continued)

resistance electric contact while the epitaxial layer and field/corner dielectric layers are—etched only minimally or not at all.

8 Claims, 8 Drawing Sheets

(51) Int. Cl.
    *H01L 21/3105*     (2006.01)
    *H01L 21/311*     (2006.01)
    *H01L 21/67*     (2006.01)
    *H01L 21/683*     (2006.01)
    *H10D 84/01*     (2025.01)
    *H10D 84/03*     (2025.01)

(52) U.S. Cl.
    CPC .... *H01J 37/3244* (2013.01); *H01J 37/32642* (2013.01); *H01J 37/32715* (2013.01); *H01L 21/02118* (2013.01); *H01L 21/31058* (2013.01); *H01L 21/67069* (2013.01); *H01L 21/6835* (2013.01); *H10D 84/0135* (2025.01); *H10D 84/038* (2025.01); *H01J 2237/334* (2013.01)

(58) Field of Classification Search
    CPC ................ H01J 37/321; H01J 37/3244; H01J 37/32642; H01J 37/32715; H01J 2237/334; H01L 21/31116; H01L 21/02118; H01L 21/31058; H01L 21/67069; H01L 21/6835; H01L 21/823437
    USPC .................................................... 156/345.33
    See application file for complete search history.

(56) References Cited

U.S. PATENT DOCUMENTS

| | | |
|---|---|---|
| 10,170,336 B1 | 1/2019 | Li et al. |
| 11,562,909 B2* | 1/2023 | Lei ...................... H01L 21/6835 |
| 2002/0123226 A1 | 9/2002 | Trapp |
| 2006/0231524 A1 | 10/2006 | Liu |
| 2006/0240655 A1 | 10/2006 | Lee |
| 2007/0074814 A1* | 4/2007 | Hahn ................ H01L 21/67207 |
| | | 156/345.31 |
| 2008/0289766 A1 | 11/2008 | Heemstra |
| 2014/0090783 A1* | 4/2014 | Kim .................. H01J 37/32651 |
| | | 156/345.48 |
| 2015/0170943 A1 | 6/2015 | Nguyen et al. |
| 2016/0027616 A1* | 1/2016 | Ramaswamy ....... H01J 37/3211 |
| | | 315/111.51 |
| 2017/0263623 A1 | 9/2017 | Zhang et al. |
| 2018/0096818 A1* | 4/2018 | Lubomirsky ....... H01J 37/3244 |
| 2019/0122861 A1 | 4/2019 | Rozenzon et al. |
| 2019/0157088 A1 | 5/2019 | Adusumilli |
| 2019/0198333 A1* | 6/2019 | Tokashiki ......... H01L 21/67109 |
| 2020/0006334 A1 | 1/2020 | Hsueh et al. |
| 2020/0105615 A1 | 4/2020 | Lee et al. |
| 2021/0366722 A1* | 11/2021 | Lei ........................ H01J 37/321 |

FOREIGN PATENT DOCUMENTS

| | | |
|---|---|---|
| CN | 110648919 A | 1/2020 |
| JP | 2004119644 A | 4/2004 |
| JP | 2017208469 A | 11/2017 |
| JP | 2019119918 A | 7/2019 |
| TW | 552683 B | 9/2003 |

* cited by examiner

DIRECTIONAL SELECTIVE JUNCTION CLEAN WITH FIELD POLYMER PROTECTIONS

CROSS-REFERENCE TO RELATED APPLICATIONS

This application is a Divisional of U.S. application Ser. No. 16/881,145, filed on May 22, 2020, the entire disclosure of which is hereby incorporated by reference herein.

TECHNICAL FIELD

Embodiments of the present disclosure pertain to the field of semiconductor processing. More particularly, embodiments of the disclosure are directed to methods for etching layers.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with selectivity towards a variety of materials.

Dry etches produced in local plasmas formed within the substrate processing region can penetrate more constrained trenches and exhibit less deformation of delicate remaining structures than wet etches. However, even though an etch process may be selective to a first material over a second material, some undesired etching of the second material may still occur.

To arrive at nodes that are less than 5 nm in order to achieve low junction contact resistance, the junction clean needs to remove completely the silicon oxide at epitaxial surface, with low epi loss, minimal critical dimension (CD) blowout, as well as minimal dielectric etching on the field and trench shoulders needed by self-alignment contact (SAC), which is implemented to avoid contact mis-alignment, downgraded performance and undesired yield loss.

There are three methods of cleaning/etching that are traditionally utilized: isotropic cleaning with ammonium fluoride ($NH_4F$) or ammonium fluoride-hydrogen fluoride ($NH_4F$—HF) formed by an $NH_3$—HF gas mixture or a remote $NH_3$—$NF_3$ plasma; directional dry etching based on $CH_xF_y$ chemistry and polymer protection; and directional selective etching based on plasma with $NH_4F$. Each method is problematic, resulting in CD blowout, or field loss, or epi loss, or high field loss.

Accordingly, there is a need for improved systems and methods that can be used to produce high quality devices and structures.

SUMMARY

One or more embodiments of the disclosure are directed to a method of etching. In one or more embodiments, the method comprises flowing a gas mixture into the processing volume of processing chamber, the processing gas comprising $CH_xF_y$; generating a plasma in the processing volume; forming a polymer layer on a sidewall and a bottom surface of a feature on a substrate, a top surface of the feature located on metal gate structures, the bottom surface of the feature comprising a dielectric layer on a top surface of an epitaxial layer, the epitaxial layer having a thickness; and removing the dielectric layer, wherein the thickness of the epitaxial layer is decreased by less than about 10 nm.

Other embodiments are directed to a processing chamber. In one or more embodiments, a processing chamber comprises: a chamber body having a lid, bottom wall, and at least one sidewall defining a processing volume; a nozzle connected to a gasline and in fluid communication with the processing volume; a gas source located outside of the chamber body and in fluid communication with the gasline; and a substrate support comprising an electrostatic chuck. In one or more embodiments, one of the lid and the electrostatic chuck is connected to an RF power source and the other of the lid and the electrostatic chuck is connected to electrical ground to generate a plasma within the gas volume.

Further embodiments are directed to a non-transitory computer readable medium including instructions, that, when executed by a controller of a processing chamber, cause the processing chamber to perform the operations of: flow a gas into the processing volume of processing chamber, the processing gas comprising $CH_xF_y$; generate a plasma in the processing volume; form a polymer layer on a sidewall and a bottom surface of a feature on a substrate, a top surface of the feature located on metal gate structures, the bottom surface of the feature comprising a dielectric layer on a top surface of an epitaxial layer, the epitaxial layer having a thickness; and remove the dielectric layer, wherein the thickness of the epitaxial layer is decreased by less than about 10 nm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

In one or more embodiments, a process for fabricating semiconductor devices involves forming electrical connections between vertically separated regions. In one or more embodiments, an etch can be performed to etch a recessed feature (also referred to as a trench or a contact hole) into a dielectric material, often silicon dioxide ($SiO_2$). This hole can then be filled with conductive material to electrically connect the vertically separated regions. Certain embodiments herein relate to methods and apparatus for etching a contact hole. In some other embodiments, the methods and apparatus described herein can be used to etch vias, trenches, or other recessed features.

Figure 1:
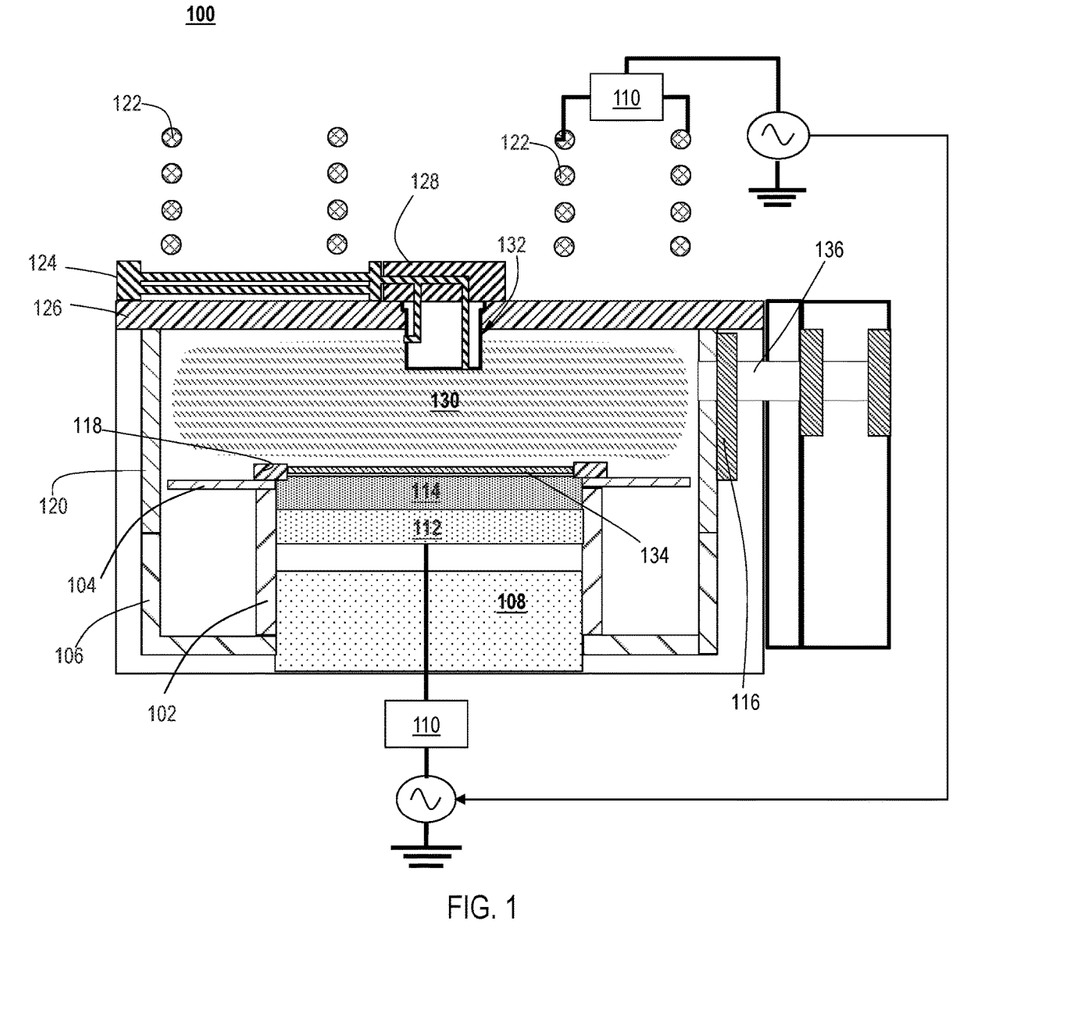
FIG. 1 illustrates a cross-sectional view of a processing chamber in accordance with one or more embodiments of the invention.

Processing chambers that may implement embodiments of the present invention may be included within processing platforms such as the Producer® system, Centris®, Centura®, Endura®, and the like, available from Applied Materials, Inc. of Santa Clara, California. FIG. 1 illustrates a cross-sectional view of one embodiment of a processing chamber.

In one or more embodiments, the method for etching features involves a reaction chamber equipped with a radio-frequency generators. During the etch, $CH_xF_y$ gases and plasma are used to selectively etch silicon dioxide. Ideally, silicon oxide is removed while the epitaxial layer is etched only minimally or not at all. In one or more embodiments, a maximum of 10 nm of the epitaxial layer is removed. In other embodiments, less than 9 nm of the epitaxial layer is removed, or less than 8 nm, or less than 7 nm, or less than 6 nm, or less than 5 nm, or less than 4 nm, or less than 3 nm, or less than 2 nm, or less than 1 nm.

Referring to FIG. 1, in one or more embodiments, an advanced plasma etch chamber 100 is equipped with $CH_xF_y$ gases including, but not limited to methyl fluoride ($CH_3F$), fluoroform ($CHF_3$), hexafluoro-1,3-butadiene ($C_4F_6$), octafluorocyclobutane ($C_4F_8$), methane ($CH_4$), carbon tetrafluoride ($CF_4$), hexafluoroethane ($C_2F_6$), ethylene ($C_2H_4$), ethane ($C_2H_6$), and the like, as well as argon (Ar), hydrogen ($H_2$), ammonia ($NH_3$), nitrogen trifluoride ($NF_3$), helium (He), nitrogen ($N_2$), oxygen ($O_2$), carbon monoxide (CO), carbon dioxide ($CO_2$), sulfur hexafluoride ($SF_6$), and hydrogen fluoride (HF), and an inductively coupled plasma (ICP) source is used as a source through vertical or planar coils 122 on chamber top (lid) 126. The gases may enter the chamber 100 through gaslines 124, hub 128, and nozzle 132. In one or more embodiments, a high-voltage DC power supply is used to electrostatically chuck (e-chuck) 114, holding the wafer (or substrate) 134. In one or more embodiments, e-chucking with quick heating and cooling to hold the wafer, a vacuum chamber consisting of an upper liner 120, a lower liner 106, a cathode liner 102, a chamber lid 126, a chamber screen door 116, an edge ring 118, cathode 108, RF plate 112, RF match 110, a plasma screen 104, pumping, and an electrostatic chuck 114 with high thermal uniformity is advantageously provides. In one or more embodiments, an electrostatic chuck 114 is essential.

In one or more embodiments, the electrostatic chuck ("ESC") 114 is part of a pedestal. The pedestal may comprise one or more of a DC electrode embedded into the ESC, and a cooling/heating base. In an embodiment, the processing chamber comprises a cathode 108. In an embodiment, the ESC comprises an aluminum oxide ($Al_2O_3$) material, aluminum nitride (AlN), or other ceramic materials, including a mixture of multiple types of ceramics such as aluminum oxide and silicon oxide known to one of ordinary skill of electronic device manufacturing. A power supply (e.g. a high-voltage DC power supply) can be connected to the electrostatic chuck 114. In some embodiments, the electrostatic chuck 114 includes a heater (not shown) that is capable of raising the temperature of the wafer/substrate to a first temperature.

As shown in FIG. 1, a substrate can be loaded through an opening 136 and placed on the electrostatic chuck 114. The chamber 100 comprises a nozzle 132 to input one or more process gases through a gasline 124. In some embodiments, a polymer film is deposited on the wafer/substrate in the chamber 100 with the electrostatic chuck 114 maintained at a temperature of about 30° C., and the pressure maintained at about 10 mTorr, with plasma 130 generated above the wafer level by applying about 600 Watts to the coils 122 on top of the lid 126. In some embodiments, two RF powers of about 100 to about 1000 Watts at 13.56 MHz and 2 MHz are delivered to the electrostatic chuck 114, generating a dual-bias plasma at the wafer level.

In an embodiment, the processing chamber 100 is an inductively coupled plasma (ICP) system. In an embodiment, the processing chamber is a system with the combination of an inductively coupled plasma (ICP) and capacitively coupled plasma (CCP).

In one or more embodiments, in order to accommodate multiple plasma chemistries, special coatings or bulk materials are implemented to the upper liner 120, a lower liner 106, a cathode liner 102, a chamber lid 126, nozzle 132, edge ring 118 and other process kits. In one or more embodiments, the special coatings or bulk materials comprise one or more of ceramics including, but not limited to, alumina, yttrium, zirconium oxide ($ZrO_2$), HPM®, PAC3®, and the like.

Figure 2:
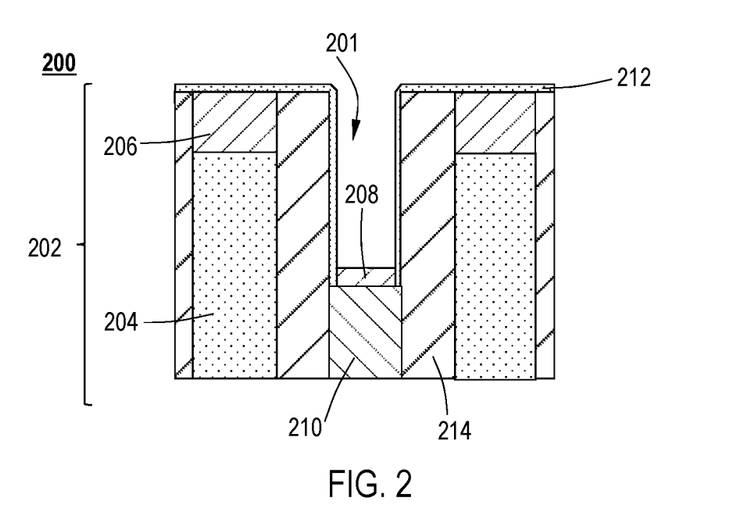
FIG. 2 illustrates a cross-sectional view of partially fabricated semiconductor devices during a method according to one or more embodiments.
Figure 3:
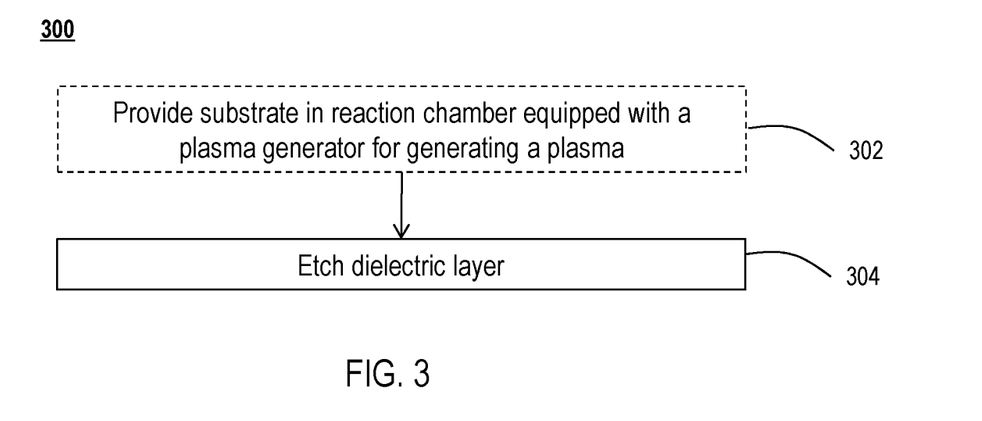
FIG. 3 illustrates a process flow diagram of a method according to one or more embodiments.

FIG. 2, illustrates a cross-sectional view of a partially fabricated semiconductor device 200 during an etch process according to one or more embodiments. FIG. 3 illustrates a process flow diagram for performing an etch process according to various embodiments. The method of FIG. 3 will be described in relation to the partially fabricated device shown in FIG. 2. The method 300 begins at operation 302, where a substrate is provided to a reaction chamber that is equipped with a plasma generator for generating a capacitively coupled plasma or an inductively coupled plasma, or a combination thereof. In one or more embodiments, the partially fabricated semiconductor device 200 comprises a metal gate structure 202 which can include one or more of a gate dielectric (e.g. hafnium oxide ($HfO_2$, or other high-k dielectric material), a metal gate 204, a cap layer 206, and a spacer 212 and 214. Between the metal gate structures 202 is a feature 201. In one or more embodiments, a dielectric layer 208 is in the bottom of the feature 201. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 2:1, 3:1, 4:1, 5:1, 10:1, or 15:1. In one or more embodiments, the feature has an aspect ratio of a height to width of at least 5:1.

In one or more embodiments, the feature 201 comprises at least one side wall and a bottom surface. The dielectric layer 208 may comprise any suitable dielectric material known to the skilled artisan. In one or more embodiments, the dielectric layer 208 comprises silicon dioxide ($SiO_2$). In one or more embodiments, the dielectric layer is on a top surface of an epitaxial layer 210.

At operation 304, a first etching operation is performed in the reaction chamber. The first etching operation is an inductively coupled plasma (ICP) etching operation. In one or more embodiments, if field dielectric loss is not a concern, the junction clean can be simplified as: wafer chucking onto electrostatic chuck with ICP plasma, ammonia ($NH_3$) and nitrogen trifluoride ($NF_3$) with a dilution gas (e.g. He or Ar) flow into chamber, strike plasma with ICP only for a few seconds to form ammonium fluoride ($NH_4F$) onto wafer/substrate and produce a thin ammonium fluorosilicate (($NH_4)_2SiF_6$) as protection towards epitaxial layer, turn on bias for certain amount of time to reach target silicon dioxide ($SiO_2$) removal, followed by pump and purge, sublimation of reaction by-product (silicate) inside or outside, before going to junction metal silicidation module.

Figure 4A:
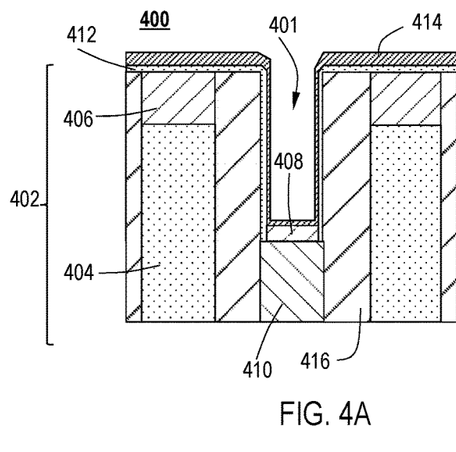
FIG. 4A illustrates a cross-sectional view of partially fabricated semiconductor devices during a method according to one or more embodiments.
Figure 4B:
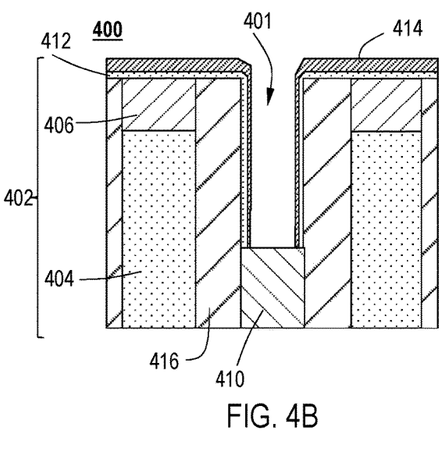
FIG. 4B illustrates a cross-sectional view of partially fabricated semiconductor devices during a method according to one or more embodiments.
Figure 5:
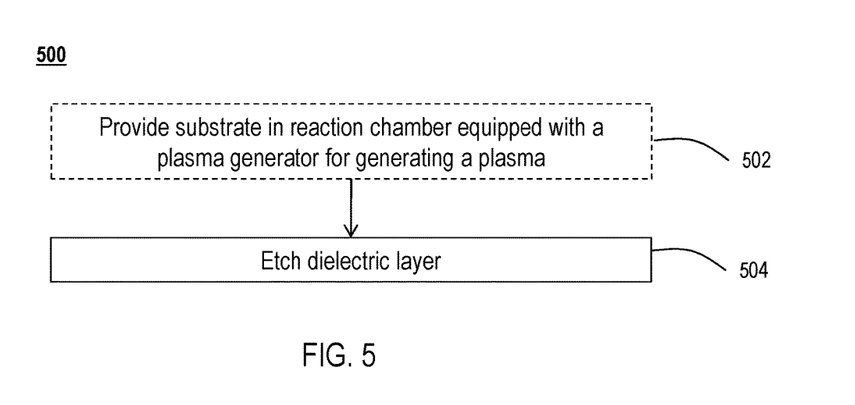
FIG. 5 illustrates a process flow diagram of a method according to one or more embodiments.
Figure 6A:
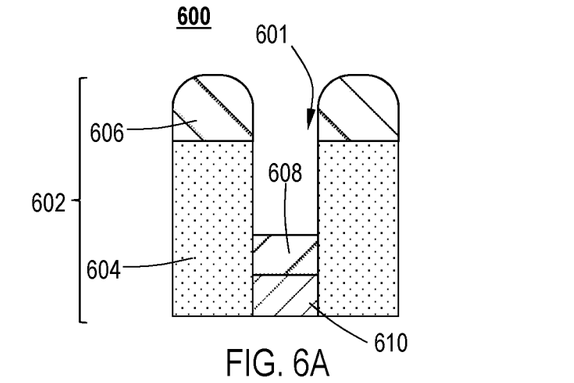
FIG. 6A illustrates a cross-sectional view of partially fabricated semiconductor devices during a method according to one or more embodiments.
Figure 6B:
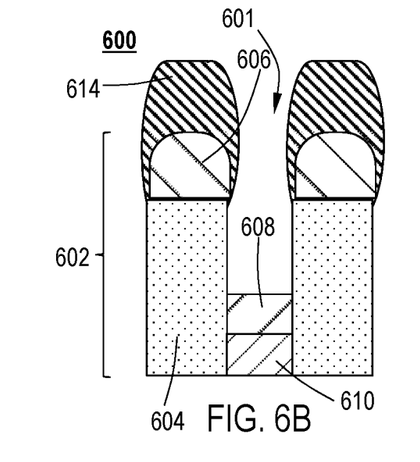
FIG. 6B illustrates a cross-sectional view of partially fabricated semiconductor devices during a method according to one or more embodiments.
Figure 6C:
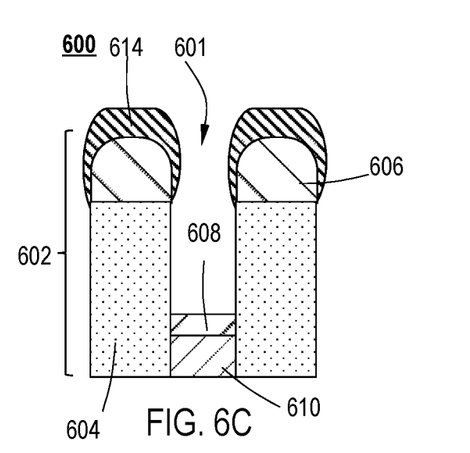
FIG. 6C illustrates a cross-sectional view of partially fabricated semiconductor devices during a method according to one or more embodiments.
Figure 6D:
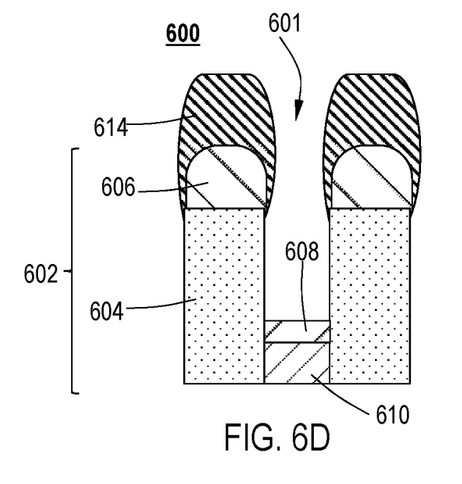
FIG. 6D illustrates a cross-sectional view of partially fabricated semiconductor devices during a method according to one or more embodiments.
Figure 6E:
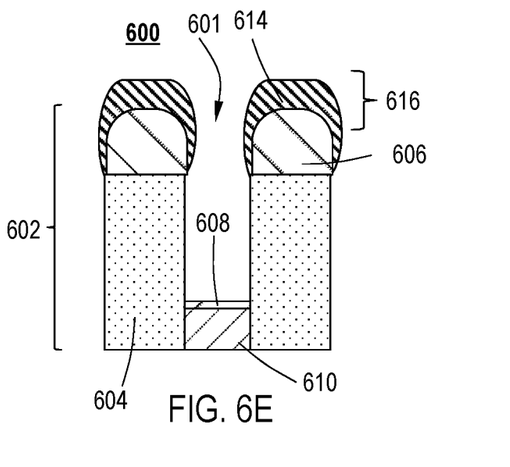
FIG. 6E illustrates a cross-sectional view of partially fabricated semiconductor devices during a method according to one or more embodiments.

FIG. 4 illustrates a cross-sectional view of a partially fabricated semiconductor device 400 during an etch process according to one or more embodiments. FIG. 5 illustrates a process flow diagram for performing an etch process according to various embodiments. The method of FIG. 5 will be described in relation to the partially fabricated device shown in FIG. 4. In one or more embodiments, the partially fabricated semiconductor device 400 comprises a metal gate structure 402 which can include one or more of a gate dielectric (e.g. hafnium oxide ($HfO_2$, or other high-k dielectric material), a metal gate 404, a cap layer 406, and a spacer 412 and 416. Between the metal gate structures 402 is a feature 401. In one or more embodiments, a dielectric layer 408 is in the bottom of the feature 401. The dielectric layer 408 may comprise any suitable dielectric material known to the skilled artisan. In one or more embodiments, the dielectric layer 408 comprises silicon dioxide ($SiO_2$). In one or more embodiments, the dielectric layer is on a top surface of an epitaxial layer 410.

In one or more embodiments, to provide polymer protection, an ICP plasma of $CH_xF_y$ mixed with dilution gases (e.g. He or Ar) with or without bias is used to deposit a carbon-based polymer layer 414, followed the $NH_3/NF_3$ directional selective plasma clean. In one or more embodiments, the $CH_xF_y$ gases comprises one or more of methyl fluoride ($CH_3F$), fluoroform ($CHF_3$), hexafluoro-1,3-butadiene ($C_4F_6$), octafluorocyclobutane ($C_4F_8$), methane ($CH_4$), carbon tetrafluoride ($CF_4$), hexafluoroethane ($C_2F_6$), ethylene ($C_2H_4$), ethane ($C_2H_6$), and the like, as well as argon (Ar), hydrogen ($H_2$), ammonia ($NH_3$), nitrogen trifluoride ($NF_3$), helium (He), nitrogen ($N_2$), oxygen ($O_2$), carbon monoxide (CO), carbon dioxide ($CO_2$), sulfur hexafluoride ($SF_6$), and hydrogen fluoride (HF). In one or more embodiments, the polymer is deposited on the at least one side wall and the bottom surface of the feature 401. In some embodiments, the aspect ratio of the feature 401 is greater than or equal to about 2:1, 3:1, 4:1, 5:1, 10:1, or 15:1. In one or more embodiments, the polymer is deposited to a thickness in a range of from about 5 nm to about 30 nm, or in a range of from about 8 nm to about 25 nm, or in a range of from about 10 nm to about 18 nm.

In one or more embodiments, since $NH_3/NF_3$ plasma etches the carbon-based polymer layer 414 as well, the carbon-based polymer layer 414 may be consumed before the target total dielectric layer 408 (e.g. silicon dioxide ($SiO_2$)) removal (such as >4 nm) is reached. In one or more embodiments, to keep field protection all the time, a cyclic process of polymer deposition and $NH_3/NF_3$ plasma clean can be implemented. In one or more embodiments, the plasma clean step time is controlled to keep field dielectrics from seeing $NH_3/NF_3$ plasma.

Other embodiments are directed to $CH_xF_y$ chemistry's passivation and etch balance at the beginning to etch silicon dioxide ($SiO_2$) until about 1 nm remains on the top of the epitaxial layer 410. In one or more embodiments, there is then a shift to ammonia/nitrogen trifluoride ($NH_3/NF_3$) directional selective plasma clean to remove the dielectric layer 408 (e.g. silicon dioxide ($SiO_2$)), stopping on the epitaxial layer 410 perfectly with much better selectivity than $CH_xF_y$ chemistry.

Silicidation Module.

Figure 7:
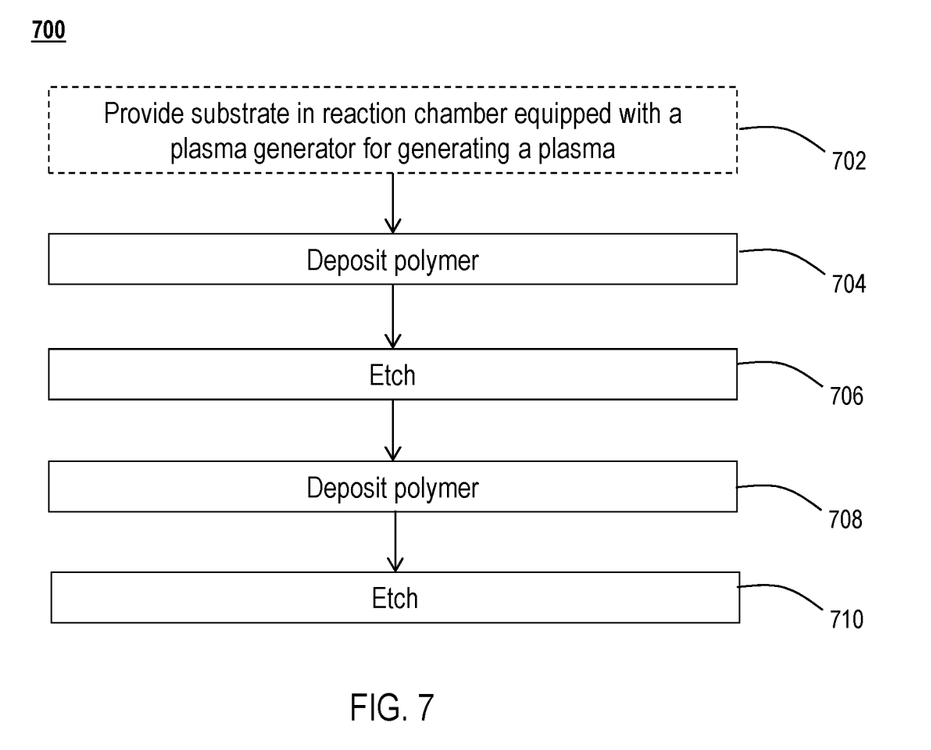
FIG. 7 illustrates a process flow diagram of a method according to one or more embodiments.

FIGS. 6A-6E illustrate cross-sectional views of a partially fabricated semiconductor device 600 during an etch process according to one or more embodiments. FIG. 7 illustrates a process flow diagram for performing an etch process according to various embodiments. The method of FIG. 7 will be described in relation to the partially fabricated device shown in FIGS. 6A-6E. In one or more embodiments, the partially fabricated semiconductor device 600 comprises a metal gate structure 602 which can include one or more of a gate dielectric (e.g. hafnium oxide ($HfO_2$, or other high-k dielectric material), a metal gate 604 and a cap layer 606. Between the metal gate structures 602 is a feature 601. In one or more embodiments, a dielectric layer 608 is in the bottom of the feature 601. The dielectric layer 608 may comprise any suitable dielectric material known to the skilled artisan. In one or more embodiments, the dielectric layer 608 comprises silicon dioxide ($SiO_2$). In some embodiments, the aspect ratio of the feature 601 is greater than or equal to about 2:1, 3:1, 4:1, 5:1, 10:1, or 15:1. In one or more embodiments, the dielectric layer is on a top surface of an epitaxial layer 610. In one or more embodiments, polymer 614 deposition and $NH_3/NF_3$ plasma clean occurs in cycles—plasma clean time per cycle is tuned to keep a thickness 616 of a few nanometers of polymer.

In one or more embodiments, the $CH_xF_y$ gases comprises one or more of methyl fluoride ($CH_3F$), fluoroform ($CHF_3$), hexafluoro-1,3-butadiene ($C_4F_6$), octafluorocyclobutane ($C_4F_8$), methane ($CH_4$), carbon tetrafluoride ($CF_4$), hexafluoroethane ($C_2F_6$), ethylene ($C_2H_4$), ethane ($C_2H_6$), and the like, as well as argon (Ar), hydrogen ($H_2$), ammonia ($NH_3$), nitrogen trifluoride ($NF_3$), helium (He), nitrogen ($N_2$), oxygen ($O_2$), carbon monoxide (CO), carbon dioxide ($CO_2$), sulfur hexafluoride ($SF_6$), and hydrogen fluoride (HF). In one or more embodiments, the polymer is deposited on the at least one side wall and the bottom surface of the feature 601.

In one or more embodiments, depositing polymer 614 onto the field is needed but the deposition of polymer at trench bottom is not desired. In one or more embodiments, plasma power of both source and bias, gas flow, pressure, addition of oxygen ($O_2$) or carbon dioxide ($CO_2$) or carbon monoxide (CO) and dilution gases, as well as RF power pulsing including advanced level-to-level pulsing can be used to optimize the polymer deposition process with minimal coating at trench bottom. In one or more embodiments, level-to-level pulsing has demonstrated a thick polymer on field and no or minimal inside trench.

Figure 8A:
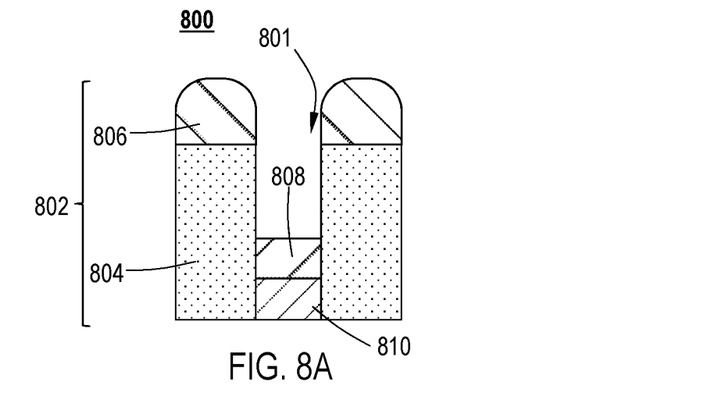
FIG. 8A illustrates a cross-sectional view of partially fabricated semiconductor devices during a method according to one or more embodiments.
Figure 8B:
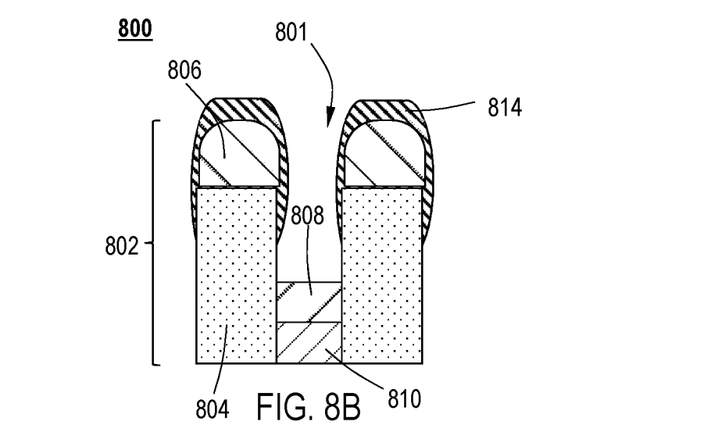
FIG. 8B illustrates a cross-sectional view of partially fabricated semiconductor devices during a method according to one or more embodiments.
Figure 8C:
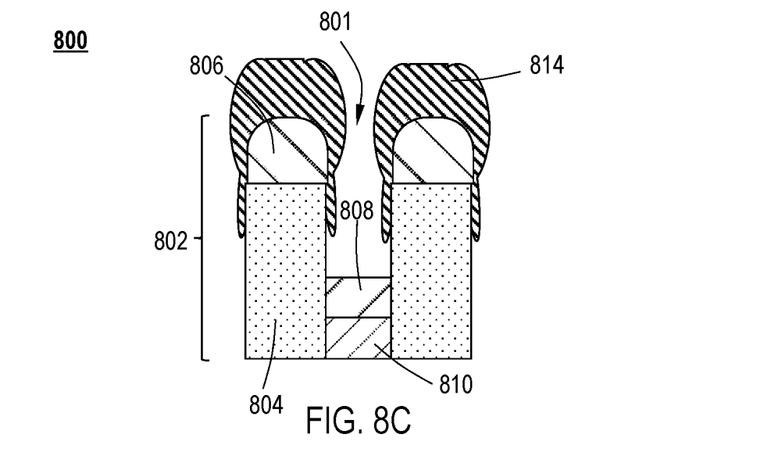
FIG. 8C illustrates a cross-sectional view of partially fabricated semiconductor devices during a method according to one or more embodiments.

FIGS. 8A-8C illustrate cross-sectional views of a partially fabricated semiconductor device 800 during an etch process according to one or more embodiments. In one or more embodiments, the partially fabricated semiconductor device 800 comprises a metal gate structure 802 which can include one or more of a gate dielectric (e.g. hafnium oxide ($HfO_2$, or other high-k dielectric material), a metal gate 804 and a cap layer 806. Between the metal gate structures 802 is a feature 801. In one or more embodiments, a dielectric layer 808 is in the bottom of the feature 801. The dielectric layer 808 may comprise any suitable dielectric material known to the skilled artisan. In one or more embodiments, the dielectric layer 808 comprises silicon dioxide ($SiO_2$). In one or more embodiments, in order to protect trench shoulders beside the field, the polymer coverage over the shoulder needs to be adjusted accordingly, along with tuning for minimal polymer at trench bottom. In one or more embodiments, this involves a 2-step polymer deposition process, as illustrated in FIGS. 8A-8C.

Figure 9:
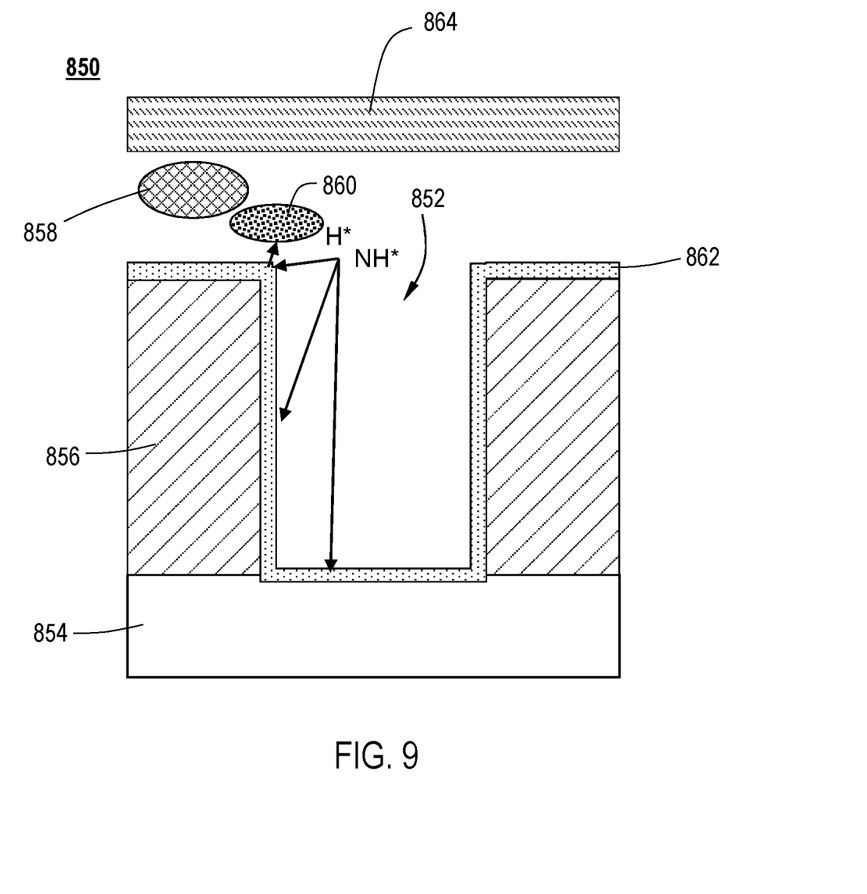
FIG. 9 illustrates a cross-sectional view of partially fabricated semiconductor devices during a method according to one or more embodiments.

Referring to FIG. 9, additionally, in one or more embodiments, a polymer stripping process using ICTP with ammonia ($NH_3$) or a mixture of nitrogen ($N_2$)/hydrogen ($H_2$) can be used to remove any polymer residue 862, releasing methane ($CH_4$) 858 and/or hydrogen fluoride (HF) 860, from the wafer and junction contact trenches 852, which is essential to ensure pristine epitaxial layer interface before silicidation. In one or more embodiments, this can be done in the same chamber proposed in this invention or separate ones.

Figure 10:
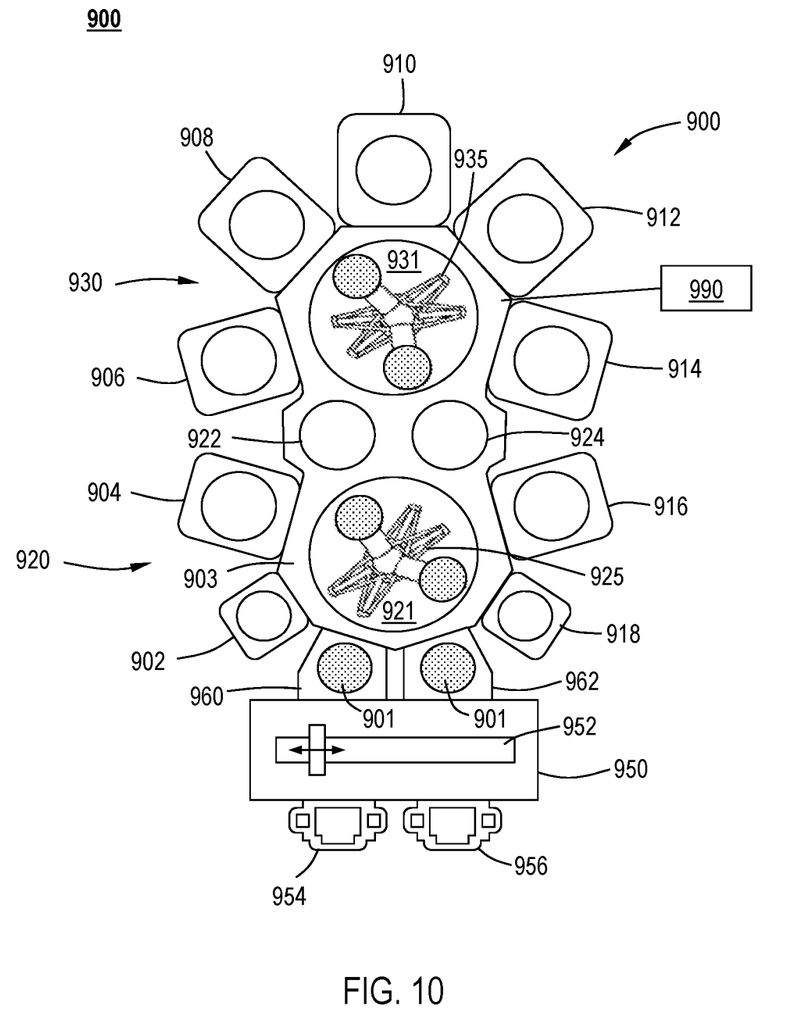
FIG. 10 illustrates a cluster tool according to one or more embodiments of the disclosure.

Additional embodiments of the disclosure are directed to processing tools 900 that can be used with the processing chamber of one or more embodiments to perform the methods described, as shown in FIG. 10.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cooling chamber, a deposition chamber, annealing chamber, etching chamber, a thermal processing (RTP) chamber, a plasma oxidation chamber, a plasma nitridation chamber, and an atomic layer deposition (ALD) chamber. The particular arrangement of process chambers and components can be varied depending on the cluster tool and should not be taken as limiting the scope of the disclosure.

In the embodiment shown in FIG. 10, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing chamber comprising:
   a chamber body having a lid, bottom wall, and at least one sidewall defining a processing volume;
   a nozzle connected to a gasline and in fluid communication with the processing volume;
   a gas source located outside of the chamber body and in fluid communication with the gasline, the gas source comprising a gas comprising $CH_xF_y$;
   a plurality of coils on the lid of the chamber body and near the gasline, the plurality of coils configured to generate an inductively coupled plasma (ICP) of the gas in the processing volume;

a substrate support comprising an electrostatic chuck, the electrostatic chuck configured to generate a capacitively coupled plasma (CCP) of the gas in the gas-processing volume;

wherein one of the lid and the electrostatic chuck is connected to an RF power source and the other of the lid and the electrostatic chuck is connected to electrical ground to generate a plasma within the processing volume;

a controller configured to cause the processing chamber to perform operations of:

flowing the ICP of the gas into the processing volume of the processing chamber to form a polymer layer on a sidewall and a bottom surface of a feature on a substrate, the feature located between a first metal gate structure and a second metal gate structure, the bottom surface of the feature comprising a dielectric layer on a top surface of an epitaxial layer, and selectively removing the dielectric layer by flowing the CCP of the gas into the processing volume of the processing chamber.

2. The processing chamber of claim 1, further comprising a heater.

3. The processing chamber of claim 1, further comprising at least one edge ring on a top surface of the electrostatic chuck.

4. The processing chamber of claim 3, further comprising the substrate on the top surface of the electrostatic chuck.

5. The processing chamber of claim 4, wherein the first metal gate structure and the second metal gate structure comprise one or more of a metal gate, a cap layer, and a spacer.

6. A non-transitory computer readable medium including instructions, that, when executed by a controller of a processing chamber, cause the processing chamber to perform operations of:

flowing a gas into a processing volume of the processing chamber, the gas comprising CHxFy;

generating an inductively coupled plasma (ICP) of the gas in the processing volume;

forming a polymer layer on a sidewall and a bottom surface of a feature on a substrate, the feature located between a first metal gate structure and a second metal gate structure, the bottom surface of the feature comprising a dielectric layer on a top surface of an epitaxial layer; and selectively removing the dielectric layer by flowing a capacitively coupled plasma (CCP) of the gas into the processing volume of the processing chamber.

7. The non-transitory computer readable medium of claim 6, including instructions that, when executed by the controller of the processing chamber, cause the processing chamber to perform further operations of:

stripping the polymer layer with ammonia ($NH_3$) or nitrogen ($N_2$)/hydrogen ($H_2$) plasma.

8. The processing chamber of claim 1, wherein the gas is selected from one or more of methyl fluoride ($CH_3F$), fluoroform ($CHF_3$), hexafluoro-1,3-butadiene ($C_4F_6$), octafluorocyclobutane ($C_4F_8$), methane ($CH_4$), carbon tetrafluoride ($CF_4$), hexafluoroethane ($C_2F_6$), ethylene ($C_2H_4$), ethane ($C_2H_6$), argon (Ar), hydrogen ($H_2$), ammonia ($NH_3$), nitrogen trifluoride ($NF_3$), helium (He), nitrogen ($N_2$), oxygen ($O_2$), carbon monoxide (CO), carbon dioxide ($CO_2$), sulfur hexafluoride ($SF_6$), and hydrogen fluoride (HF).

* * * * *